United States Patent
Ishizaka et al.

(10) Patent No.: US 10,199,451 B2
(45) Date of Patent: Feb. 5, 2019

(54) LOWER ELECTRODE OF DRAM CAPACITOR AND MANUFACTURING METHOD THEREOF

(71) Applicant: TOKYO ELECTRON LIMITED, Tokyo (JP)

(72) Inventors: Tadahiro Ishizaka, Yamanashi (JP); Masaki Koizumi, Yamanashi (JP); Masaki Sano, Yamanashi (JP); Seokhyoung Hong, Yamanashi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 11 days.

(21) Appl. No.: 15/386,741

(22) Filed: Dec. 21, 2016

(65) Prior Publication Data

US 2017/0179219 A1    Jun. 22, 2017

(30) Foreign Application Priority Data

Dec. 21, 2015 (JP) ................. 2015-248362

(51) Int. Cl.
   *H01L 49/02*    (2006.01)
(52) U.S. Cl.
   CPC .............. *H01L 28/75* (2013.01); *H01L 28/00* (2013.01)
(58) Field of Classification Search
   CPC ......................... H01L 28/75; H01L 27/108
   USPC .......................................... 257/532; 438/396
   See application file for complete search history.

(56) References Cited

U.S. PATENT DOCUMENTS

| | | | | |
|---|---|---|---|---|
| 5,514,908 A * | 5/1996 | Liao | .................. | H01L 21/28518 257/751 |
| 5,652,464 A * | 7/1997 | Liao | .................. | H01L 21/28518 257/751 |
| 6,146,998 A * | 11/2000 | Yamaha | .............. | H01L 21/7684 257/E21.583 |
| 6,225,656 B1 * | 5/2001 | Cuchiaro | .......... | H01L 27/11502 257/295 |
| 6,238,803 B1 * | 5/2001 | Fu | ........................ | C23C 14/0641 257/E21.169 |
| 6,423,591 B2 * | 7/2002 | Nakamura | ........ | H01L 27/10852 257/301 |
| 6,495,428 B1 * | 12/2002 | Rhodes | ................... | H01L 28/75 257/E21.009 |
| 6,824,825 B2 * | 11/2004 | Otsuki | ................ | C23C 16/0218 257/E21.01 |
| 6,911,364 B2 | 6/2005 | Oh et al. | | |

(Continued)

FOREIGN PATENT DOCUMENTS

| | | |
|---|---|---|
| JP | 2007-201083 | 8/2007 |
| JP | 2011-096818 A | 5/2011 |
| JP | 2015-506097 | 2/2015 |

OTHER PUBLICATIONS

E. Cartier, M. Hopstaken et al., Oxygen passivation of vacancy defects in metal-nitride gated $HfO_2/SiO_2/Si$ devices, Jul. 27 2009, American Institute of Physics.

*Primary Examiner* — Igwe U Anya

(57) ABSTRACT

A lower electrode is made of a TiN-based material and provided at a base of a dielectric film in a DRAM capacitor. The lower electrode includes first TiON films provided at opposite outer sides, the first TiON films having a relatively low oxygen concentration, and a second TiON film provided between the first TiON films, the second TiON film having a relatively high oxygen concentration.

17 Claims, 11 Drawing Sheets

(56) References Cited

U.S. PATENT DOCUMENTS

| | | |
|---|---|---|
| 2003/0129309 A1 | 7/2003 | Otsuki |
| 2006/0113578 A1* | 6/2006 | Chung ............... H01L 21/7687 |
| | | 257/303 |
| 2007/0173028 A1 | 7/2007 | Komeda |
| 2008/0087930 A1* | 4/2008 | Lee ....................... H01G 4/005 |
| | | 257/300 |
| 2012/0074513 A1 | 3/2012 | Mitsui et al. |
| 2013/0149852 A1 | 6/2013 | Nakamura et al. |
| 2017/0069711 A1* | 3/2017 | Lee ........................ H01L 28/75 |

* cited by examiner

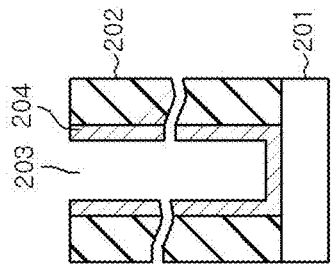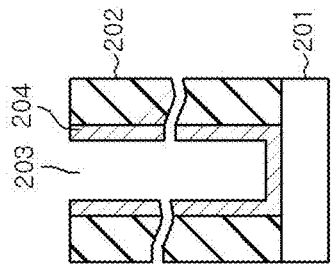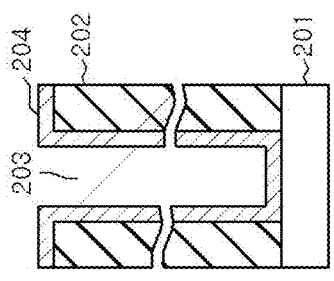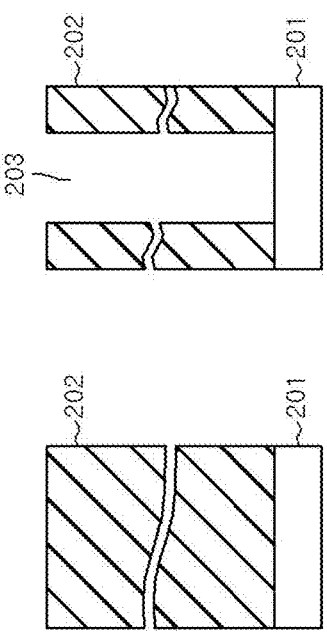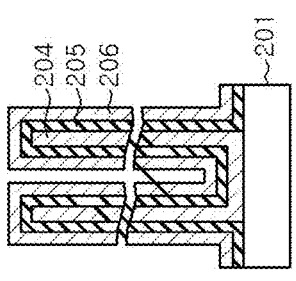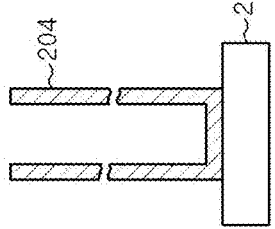

FIG.3

| TiN | LOW OXYGEN CONCENTRATION TION (33~38at.%) | INTERMEDIATE OXYGEN CONCENTRATION TION (46at.%) | HIGH OXYGEN CONCENTRATION TION (55at.%) | |
|---|---|---|---|---|
| HARDLY CHANGED | HARDLY CHANGED | CORRODED | FILM LOST | OPTICAL MICROSCOPE x5 |
| | | | N/A | OPTICAL MICROSCOPE x50 |

LOWER ELECTRODE OF DRAM CAPACITOR AND MANUFACTURING METHOD THEREOF

CROSS-REFERENCE TO RELATED APPLICATIONS

This application claims priority to Japanese Patent Application No. 2015-248362 filed on Dec. 21, 2015, the entire contents of which is incorporated herein by reference.

FIELD OF THE INVENTION

The disclosure relates to a lower electrode of a DRAM capacitor and a manufacturing method thereof.

BACKGROUND OF THE INVENTION

Recently, a high-k film made of a high-k material is used for a capacitor unit in order to increase a capacity of a DRAM.

As for the high-k film, a laminated film of oxides such as $HfO_2$ and $ZrO_2$ or $Al_2O_3$ and $ZrO_2$ is used. However, in the case of using such an oxide material for the semiconductor devices, an oxygen vacancy may occur in the high-k film. If the oxygen vacancy occurs in the high-k film, a dipole is generated at an interface of the electrode or the metal gate adjacent to the high-k film and a band is bent by the dipole, which leads to a low effective work function. As a result, electrons readily flow and a leakage current is increased.

As for a technique for solving the above drawback, techniques for reducing oxygen vacancy in a high-k film by adding oxygen to a TiN film used as the electrode adjacent to the high-k film are disclosed in Japanese Patent Application Publication No. 2015-506097 and E. Cartier, et al., Appl. Phys. Lett., Vol. 95, 2009, p. 042901.

As for a DRAM capacitor, there is known a structure in which a dielectric film is formed on a lower electrode made of a TiN film and an upper electrode made of a TiN film is formed on the dielectric film (see, Japanese Patent Application Publication No. 2007-201083). As for a method for manufacturing a DRAM capacitor having a large capacity, there is known a method disclosed in U.S. Pat. No. 6,911,364. In this method, first, a mold oxide film is formed on a substrate and, then, a recess is formed by etching the mold oxide film. Next, a film serving as a lower electrode is formed at an inner wall of the recess and a field portion of the film is etched back. Then, the mold oxide film is removed by dilute hydrofluoric acid, so that a cylindrical lower electrode remains. Next, a high-k film is formed on a surface of the cylindrical lower electrode and an upper electrode is formed thereon.

However, in the case of forming a capacitor of a DRAM by the method disclosed in U.S. Pat. No. 6,911,364, the lower electrode is immersed in the fluoric acid HF during the removal of the mold oxide film and is exposed to an oxygen-based gas (e.g., $O_2$ gas or $O_3$ gas) serving as an oxidizing agent during the formation of the high-k film.

Therefore, the lower electrode needs to have high resistance to hydrofluoric acid and less stress change caused by the oxygen-based gas.

However, in the case of using as the lower electrode a TiN film added with oxygen which is disclosed in Japanese Patent Application Publication No. 2015-506097 and E. Cartier, et al., Appl. Phys. Lett., Vol. 95, 2009, p. 042901, it is difficult to realize high resistance to hydrofluoric acid and suppression of stress change caused by the oxygen-based gas.

SUMMARY OF THE INVENTION

In view of the above, the disclosure provides a lower electrode of a DRAM capacitor which is capable of realizing high resistance to hydrofluoric acid and suppression of stress changes caused by an oxygen-based gas, and a manufacturing method thereof.

In accordance with an aspect, there is provided a lower electrode which is made of a TiN-based material and provided at a base of a dielectric film in a DRAM capacitor, including: first TiON films provided at opposite outer sides, the first TiON films having a relatively low oxygen concentration; and a second TiON film provided between the first TiON films, the second TiON film having a relatively high oxygen concentration.

In accordance with another aspect, there is provided a method of manufacturing a lower electrode which is made of a TiN-based material and provided at a base of a dielectric film in a DRAM capacitor, the method including: accommodating a target substrate in a processing chamber, maintaining an inside of the processing chamber in a depressurized state, and forming a first TiON film having a relatively low oxygen concentration by repeating a predetermined number of times a cycle of forming a unit nitride film at a predetermined processing temperature by alternately supplying a Ti-containing gas and a nitriding gas multiple times with a process of purging the inside of the processing chamber interposed therebetween and then oxidizing the unit nitride film by supplying an oxidizing agent; forming a second TiON film having a relatively high oxygen concentration on the first TiON film by repeating a predetermined number of times a cycle of forming a unit nitride film by alternately supplying the Ti-containing gas and the nitriding gas multiple times with the process of purging the inside of the processing chamber interposed therebetween and then oxidizing the unit nitride film by supplying the oxidizing agent; and forming another first TiON film as an uppermost layer, wherein oxygen concentrations of the first TiON film and the second TiON film are controlled by at least one of the number of alternate supply of the Ti-containing gas and the nitriding gas in the case of forming the unit nitride film, an oxidation time of the unit nitride film, and a flow rate of the oxidizing agent in the oxidation process.

In accordance with still another aspect, there is provided a method of manufacturing a lower electrode which is made of a TiN-based material and provided at a base of a dielectric film in a DRAM capacitor, the method including: accommodating a target substrate in a processing chamber, maintaining an inside of the processing chamber in a depressurized state, and forming a first TiON film having a relatively low oxygen concentration by repeating a predetermined number of times a cycle of forming a unit nitride film at a predetermined processing temperature by alternately supplying a Ti-containing gas and a nitriding gas multiple times with a process of purging the inside of the processing chamber interposed therebetween and then oxidizing the unit nitride film by supplying an oxidizing agent; forming a second TiON film having a relatively high oxygen concentration on the first TiON film by repeating a predetermined number of times a cycle of forming a unit nitride film by alternately supplying the Ti-containing gas and the nitriding gas multiple times with the process of purging the inside of oxidizing the unit nitride film by supplying the oxidizing agent; forming a TiN film on the second TiON film by alternately supplying the Ti-containing gas and the nitriding gas with the process of purging the inside of the processing chamber interposed therebetween; forming another second TiON film on the TiN film; and forming another first TiON film on the another second TiON film, wherein oxygen concentrations of the first and the second TiON film are controlled by at least one of the number of alternate supply of the Ti-containing gas and the nitriding gas in the case of forming the unit nitride film, an oxidation time of the unit nitride film, and a flow rate of the oxidizing agent in the oxidation process.

BRIEF DESCRIPTION OF THE DRAWINGS

The objects and features of the disclosure will become apparent from the following description of embodiments, given in conjunction with the accompanying drawings, in which:

FIGS. 1A to 1G are process cross sectional views schematically showing a method for manufacturing a DRAM capacitor having a lower electrode according to an embodiment;

FIG. 3 shows a test result of corrosion resistance of a TiN film, a TiON film having a low oxygen concentration, a TiON film having an intermediate oxygen concentration, and a TiON film having a high oxygen concentration against hydrofluoric acid;

DETAILED DESCRIPTION OF THE EMBODIMENTS

Figure 2:
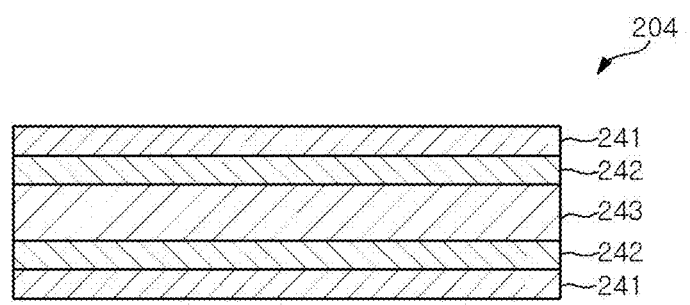
FIG. 2 is a cross sectional view showing an example of the lower electrode according to the embodiment.

Hereinafter, embodiments will be described in detail with reference to accompanying drawings.
(Method for Manufacturing DRAM Capacitor)
FIGS. 1A to 1G are process cross sectional views schematically showing a method for manufacturing a DRAM capacitor having a lower electrode according to one embodiment.

First, a mold oxide film 202 made of $SiO_2$ and having a thickness of 1 μm or above is formed on a semiconductor substrate 201 such as a silicon substrate or the like (see FIG. 1A). Then, the mold oxide film 202 is etched, thereby forming a cylindrical recess 203 having an aspect ratio of 100 or above (see FIG. 1B). Next, as will be described later, a lower electrode 204 made of a TiN-based material including a TiON film is formed on the mold oxide film 202 and the exposed semiconductor substrate 201 (see FIG. 1C). Thereafter, a top surface of the mold oxide film 202 is etched-back (see FIG. 1D). Then, the mold oxide film 202 is removed by hydrofluoric acid HF and only the cylindrical lower electrode 204 exists on the semiconductor substrate 201 (see FIG. 1E).

Then, a dielectric film (high-k film) 205 made of a high-k material is formed on the surface of the cylindrical lower electrode 204 (see FIG. 1F). The high-k film 205 is used as a capacitor insulating film. As for the high-k film 205, a laminated film of oxides such as $HfO_2$ and $ZrO_2$ or $Al_2O_3$ and $ZrO_2$ is used. The high-k film 205 is formed by an Atomic Layer Deposition (ALD) method in which a raw material gas containing Hf or the like and an oxygen-based gas (e.g., $O_2$ gas or $O_3$ gas) as an oxidizing agent are alternately supplied.

Then, an upper electrode 206 including a TiON film is formed on the surface of the high-k film 205 (see FIG. 1G). As a consequence, a DRAM capacitor is manufactured.
(Lower Electrode Structure)
Hereinafter, the lower electrode of the DRAM capacitor which is manufactured as described above will be explained.

FIG. 2 is a cross sectional view showing an example of the lower electrode of the DRAM capacitor.

In this example, the lower electrode 204 has a five-layer laminated structure made of a TiN-based material, in which two first TiON films 241 are provided at opposite outer sides, two second TiON films 242 are provided between the first TiON films 241, and a TiN film 243 serving as a central layer is provided between the second TiON films 242.

The TiON film is obtained by adding oxygen to the TiN film. By forming the TiON film at the uppermost side and the lowermost side of the lower electrode 204, it is possible to suppress occurrence of oxygen deficiency which is caused by separation of oxygen from the oxide forming the dielectric film (high-k film) 205 formed on the surface of the lower electrode 204.

The upper and lower first TiON films 241 have a relatively low oxygen concentration and the second TiON films 242 formed therebetween have a relatively high oxygen concentration. When the lower electrode 204 is formed, the first TiON film 241, the second TiON film 242, the TiN film 243, the second TiON film 242, and the first TiON film 241 are formed in that order on the surface of the mold oxide film 202 after the formation of the recess 203 and the exposed surface of the semiconductor substrate 201. The two first TiON films 241 and the two second TiON films 242 have the same thickness, and the lower electrode 204 has a symmetrical structure in a thickness direction. Even after the mold oxide film 202 is removed, the symmetrical structure is maintained.

The first TiON films 241 having a relatively low oxygen concentration are provided at the uppermost side and the lowermost side because the resistance of the TiON film to hydrofluoric acid HF is improved as the oxygen concentration decreases.

As described above, when the DRAM capacitor is manufactured, the step of removing the mold oxide film by hydrofluoric acid HF is performed. In that case, the lower electrode 204 is immersed in hydrofluoric acid HF and, thus, the lower electrode 204 requires resistance to hydrofluoric acid HF. As a result of the examination of the relation between the oxygen concentration of the TiON film and the resistance to hydrofluoric acid HF, the resistance of the TiON film is improved as the oxygen concentration decreases.

The test result is shown in FIG. 3. FIG. 3 shows the result of the test that has examined the corrosion resistance of the TiN film, the TiON film having a low oxygen concentration (33 at. % to 38 at. %), the TiON film having an intermediate oxygen concentration (46 at. %), and the TiON film having a high oxygen concentration (55 at. %) against hydrofluoric acid. In this case, a sample obtained by forming an $SiO_2$ film on the silicon substrate and then forming the TiN film or the TiON film having the above-described oxygen concentration with a thickness of 10 nm was immersed in 49% hydrofluoric acid HF for 30 sec and, then, the surface state was monitored by a 5 magnification optical microscope and a 50 magnification optical microscope.

As a result, as can be seen from FIG. 3, the TiN film and the TiON film having a low oxygen concentration were hardly changed after the immersion in hydrofluoric acid. However, the TiON film having an intermediate oxygen concentration was corroded and the TiON film having a high oxygen concentration and the $SiO_2$ film formed therebelow were lost. Accordingly, a silver-colored silicon substrate was exposed.

Since the resistance of the TiON film to hydrofluoric acid HF is improved as the oxygen concentration decreases, the first TiON film 241 having a relatively low oxygen concentration is formed at the surface region of the lower electrode 204 which is immerged in hydrofluoric acid HF.

The oxygen concentration of the first TiON film 241 is preferably lower than or equal to 40 at. % in view of improvement of the resistance to hydrofluoric acid and more preferably higher than or equal to 30 at. % in view of suppression of oxygen deficiency caused by separation of oxygen from the oxide forming the dielectric film (high-k film) 205. The film thickness of the first TiON film 241 is preferably within a range from 0.5 nm to 5 nm in view of improvement of the resistance to hydrofluoric acid.

The second TiON film 242 having a relatively high oxygen concentration is provided between the TiN film 243 and each of the first TiON films 241 in order to reduce the stress change of the lower electrode 204 having a laminated film structure.

As described above, when the DRAM capacitor is manufactured, the step of forming the dielectric film (high-k film) 205 on the lower electrode 204 is performed. In that case, the lower electrode is exposed to the heated oxygen-based gas ($O_2$ gas or $O_3$ gas) used as the oxidizing agent. Conventionally, the oxygen-based gas causes a relatively large stress change in the TiN film used as the lower electrode. If the stress change occurs in the film, a problem such as a pattern damage or the like may be generated. As a result of the examination of the relation between the oxygen concentration of the TiON film and the stress change, it has been found that the stress change of the TiON film is reduced as the oxygen concentration increases.

Figure 4:
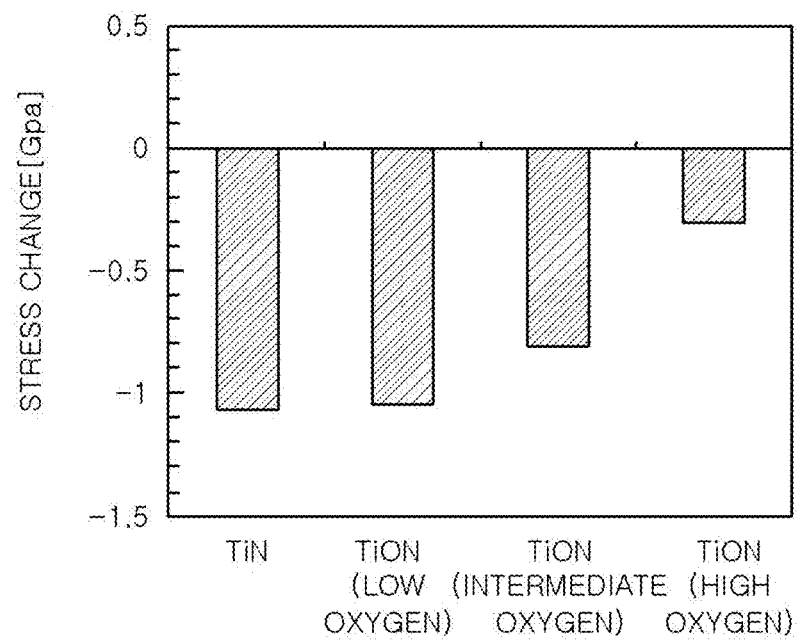
FIG. 4 shows stress changes of the TiN film, the TiON film having a low oxygen concentration, the TiON film having an intermediate oxygen concentration, and the TiON film having a high oxygen concentration.

The test result is shown in FIG. 4. FIG. 4 shows stress changes of the TiN film, the TiON film having a low oxygen concentration (33 at. % to 38 at. %), the TiON film having an intermediate oxygen concentration (46 at. %), and the TiON film having a high oxygen concentration (55 at. %). In this case, a sample obtained by forming an $SiO_2$ film on a silicon substrate and then forming a TiN film or a TiON film having the above-described oxygen concentration with a thickness of 10 nm was subjected to $O_3$ gas annealing at 300° C. for 90 sec and the stress change of the film was measured by a stress measuring device.

As can be seen from FIG. 4, the absolute value of the stress change of the TiN film exceeds 1 GPa. The absolute value of the stress change of the TiON film decreases as the oxygen concentration increases. The absolute value of the stress change of the TiON film having a high oxygen concentration is 0.3 GPa which is about ⅓ of that of the TiN film.

The stress change of the TiON film is reduced as the oxygen concentration is increased. Therefore, the stress change of the entire lower electrode 204 can be suppressed by providing the second TiON film 242 having a relatively high oxygen concentration between each of the outer first TiON films 241 and the central TiN film 243. Since the lower electrode 204 has a structure in which the two first TiON films 241, the two second TiON films 242, and the central TiN film 243 are symmetrical in a thickness direction, the film stress becomes uniform.

The oxygen concentration of the second TiON film 242 is preferably higher than 40 at. % and more preferably higher than or equal to 50 at. % in view of suppression of the stress change. The film thickness of the second TiON film 242 is preferably within a range from 0.5 nm to 5 nm in view of reduction of the stress change.

It is preferable that the lower electrode 204 has a low resistance and the central portion thereof does not need to have oxygen. Thus, the TiN film 243 having a resistance lower than that of the TiON film is formed at the central portion of the lower electrode 204. The thickness of the TiN film 243 is obtained by subtracting the thicknesses of the first TiON films 241 and the second TiON films 242 from the entire thickness of the lower electrode 204. The entire thickness of the lower electrode 204 is preferably within a range from 5 nm to 20 nm. The thickness of the TiN film is within a range from 3 nm to 10 nm in consideration of the film thickness of the first and the second TiON film 241 and 242.

Figure 5:
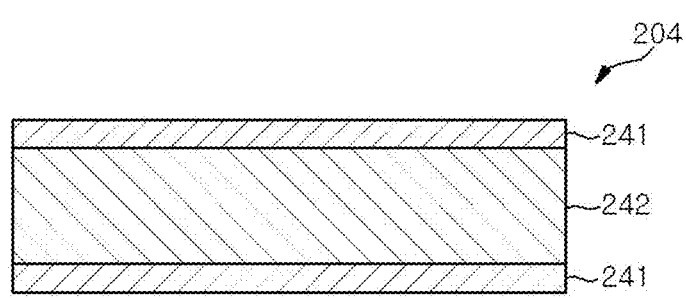
FIG. 5 is a cross sectional view showing another example of the lower electrode according to the embodiment.
Figure 6:
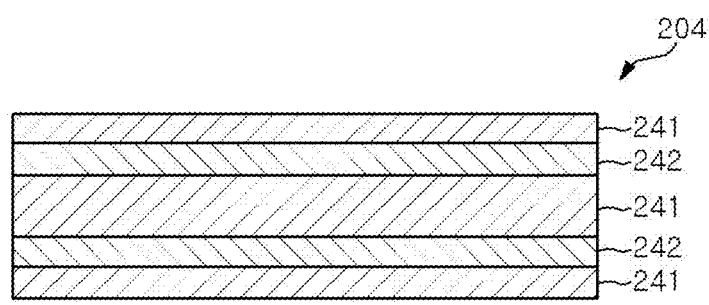
FIG. 6 is a cross sectional view showing still another example of the lower electrode according to the embodiment.

In the example shown in FIG. 2, the lower electrode 204 has a five-layer structure including the two first TiON films 241 provided at the opposite outer sides, the two second TiON films 242 provided between the two first TiON films 241, and the central TiN film 243 provided between the two second TiON films 242. However, as shown in FIG. 5, the lower electrode 204 may have a three-layer structure including the first TiON films 241 formed at the uppermost side and the lowermost side and the second TiON film 242 formed at the center. Or, as shown in FIG. 6, the lower electrode 204 may have a five-layer structure including a TiON film, e.g., the first TiON film 241, having an oxygen concentration lower than that of the second TiON film 242 instead of the central TiN film 243 in the structure of FIG. 2.

(Method for Manufacturing Lower Electrode)

Hereinafter, a method for manufacturing a lower electrode of a DRAM capacitor which is configured as described above will be explained.

First, a film forming apparatus for manufacturing the lower electrode 204 will be described.

Figure 7:
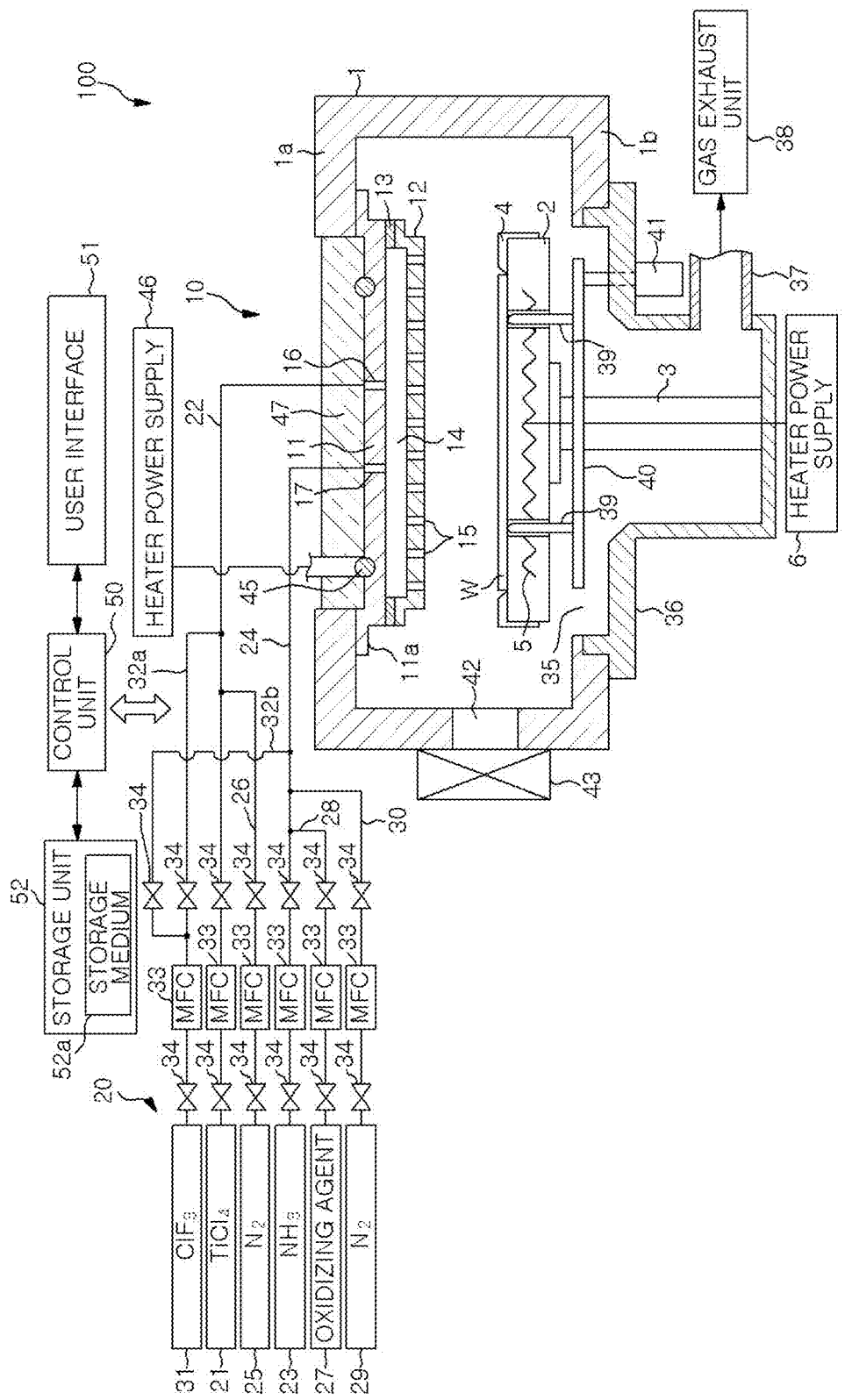
FIG. 7 is a schematic cross sectional view showing an example of a film forming apparatus for forming films of the lower electrode according to the embodiment.

FIG. 7 is a schematic cross sectional view showing an example of a film forming apparatus used for forming films of the lower electrode.

The film forming apparatus 100 includes a substantially cylindrical chamber 1. In the chamber 1, a susceptor 2 made of AlN is supported by a cylindrical supporting member 3 provided at the center of the bottom portion of the chamber 1. The susceptor 2 serves as a stage for horizontally supporting a semiconductor wafer (hereinafter, simply referred to as "wafer") W having a structure in which a plurality of recesses 203 are formed at a mold oxide film 202. A guide ring 4 for guiding a wafer W is provided at an outer peripheral portion of the susceptor 2. A heater 5 made of a high-melting point metal, e.g., molybdenum or the like, is buried in the susceptor 2. The heater 5 heats the wafer W as a substrate to be processed to a predetermined temperature by power supplied from a heater power supply 6.

A shower head 10 is provided at a ceiling wall 1a of the chamber 1. The shower head 10 includes a base member 11 and a shower plate 12. An outer peripheral portion of the shower plate 12 is fixed to the base member 11 by screws (not shown) through an annular intermediate member 13 for preventing adhesion. The shower plate 12 is formed in flange shape and has a recess therein. A gas diffusion space 14 is formed between the base member 11 and the shower plate 12. A flange portion 11a is formed at an outer periphery of the base member 11 and held on the top wall 1a of the chamber 1. A plurality of gas injection holes 15 are formed in the shower plate 12. Two gas inlet holes 16 and 17 are formed at the base member 11.

The gas supply unit 20 includes a $TiCl_4$ gas supply source 21 for supplying $TiCl_4$ gas as a Ti-containing gas, and an $NH_3$ gas supply source 23 for supplying $NH_3$ gas as a nitriding gas. The $TiCl_4$ gas supply source 21 is connected to a $TiCl_4$ gas supply line 22. The $TiCl_4$ gas supply line 22 is connected to the first gas inlet hole 16. The $NH_3$ gas supply source 23 is connected to an $NH_3$ gas supply line 24. The $NH_3$ gas supply line 24 is connected to the second gas inlet hole 17.

The $TiCl_4$ gas supply line 22 is connected to a $N_2$ gas supply line 26. $N_2$ gas is supplied as a carrier gas or a purge gas from the $N_2$ gas supply source 25 to the $N_2$ gas supply line 26.

The $NH_3$ gas supply line 24 is connected to an oxidizing agent supply line 28. An oxygen-containing gas such as $O_2$ gas, $O_3$ gas, $H_2O$, $NO_2$ or the like is supplied as an oxidizing agent from the oxidizing agent supply source 27 to the oxidizing agent supply line 28. A plasma of the oxygen-containing gas may be used as the oxidizing agent. At this time, the plasma of the oxygen-containing gas may be supplied as the oxidizing agent from the oxidizing agent supply source 27 or the oxygen-containing gas may be turned into a plasma in the shower head 10. The $NH_3$ gas supply line 24 is connected to an $N_2$ gas supply line 30. $N_2$ gas is supplied as a carrier gas or a purge gas from the $N_2$ gas supply source 29 to the $N_2$ gas supply line 30.

The gas supply unit 20 includes a $ClF_3$ gas supply source 31 for supplying $ClF_3$ gas as a cleaning gas. The $ClF_3$ gas supply source 31 is connected to a $ClF_3$ gas supply line 32a. The $ClF_3$ gas supply line 32a is connected to a $TiCl_4$ gas supply line 22. Further, a $ClF_3$ gas supply line 32b branched from the $ClF_3$ gas supply line 32a is connected to the $NH_3$ gas supply line 24.

Two valves 34 and a mass flow controller 33 disposed therebetween are installed in each of the $TiCl_4$ gas supply line 22, the $NH_3$ gas supply line 24, the oxidizing agent supply line 28, the $N_2$ gas supply lines 26 and 30, and the $ClF_3$ gas supply line 32a. A valve 34 is installed in the $ClF_3$ gas supply line 32b.

Therefore, $TiCl_4$ gas from the $TiCl_4$ gas supply source 21 and $N_2$ gas from the $N_2$ gas supply source 25 reach the gas diffusion space 14 in the shower head 10 from the first gas inlet hole 16 through the $TiCl_4$ gas supply line 22. $NH_3$ gas from the $NH_3$ gas supply source 23, the oxidizing agent from the oxidizing agent supply source 27, and $N_2$ gas from the $N_2$ gas supply source 29 reach the gas diffusion space 14 in the shower head 10 from the second gas inlet hole 17 through the $NH_3$ gas supply line 24. These gases are discharged into the chamber 1 from the gas injection holes 15 of the shower plate 12.

The shower head 10 may be of a post-mix type in which $TiCl_4$ gas and $NH_3$ gas are separately supplied into the chamber 1.

As for the Ti-containing gas, tetra(isopropoxy)titanium (TTIP), titanium(IV)bromide (TiBr$_4$), titanium(IV)Iodide (TiI$_4$), tetrakisethylmethylaminotitanium (TEMAT), tetrakisdimethylaminotitanium (TDMAT), tetrakisdiethylaminotitanium (TDEAT) or the like may be used other than $TiCl_4$. As for the nitriding gas, monomethylhydrazine (MMH) may be used other than $NH_3$. As for the carrier gas and the purge gas, another inert gas such as Ar gas or the like may be used instead of $N_2$ gas.

A heater 45 for heating the shower head 10 is provided at the base member 11 of the shower head 10. The heater 45 is connected to a heater power supply 46. By supplying power from the heater power supply 46 to the heater 45, the shower head 10 is heated to a desired temperature. An insulating member 47 is provided at a recess formed at an upper portion of the base member 11 in order to increase a heating efficiency of the heater 45.

A circular opening 35 is formed at a central portion of the bottom wall 1b of the chamber 1. A gas exhaust chamber 36 protruding downward from the bottom wall 1b is provided to cover the opening 35. A gas exhaust line 37 is connected to a side surface of the gas exhaust chamber 36. The gas exhaust line 37 is connected to a gas exhaust unit 38. By operating the gas exhaust unit 38, a pressure in the chamber 1 can be decreased to a predetermined vacuum level.

Three (only two are shown) wafer supporting pins 39 for supporting and vertically moving the wafer W are provided at the susceptor 2 so as to protrude beyond and retract below the surface of the susceptor 2. The wafer supporting pins 39 are supported by a supporting table 40. The wafer supporting pins 39 are vertically moved by a driving unit 41 such as an air cylinder or the like through the supporting table 40.

Formed at a sidewall of the chamber 1 are a loading/unloading port 42 through which the wafer W is loaded/unloaded from/to a wafer transfer chamber (not shown) adjacent to the chamber 1 and a gate valve 43 for opening/closing the loading/unloading port 42.

The components of the film forming apparatus 100, i.e., the heater power supplies 6 and 46, the valves 34, the mass flow controllers 33, the driving unit 41 and the like, are connected to and controlled by a control unit 50 having a microprocessor (computer). The control unit 50 is connected to a user interface 51 including a keyboard through which an operator inputs a command to manage the film forming apparatus 100, a display for visually displaying an operation state of the film forming apparatus 100, and the like. Further, the control unit 50 is connected to a storage unit 52 for storing a program for executing various processes performed by the film forming apparatus 100 under the control of the control unit 50, a program, i.e., a processing recipe, for executing processes of the components of the film forming apparatus 100 under the processing condition and the like. The processing recipe is stored in a storage medium 52a of the storage unit 52. The storage medium may be a fixed medium such as a hard disk or the like, or may be a portable medium such as CDROM, DVD or the like. Alternatively, the processing recipe may be appropriately transmitted from another device through, e.g., a dedicated line. If necessary, a processing recipe may be retrieved from the storage unit 52 by an instruction from the user interface 51 and executed by the control unit 50. Accordingly, a desired process is performed in the film forming apparatus 100 under the control of the control unit 50.

Hereinafter, a method for manufacturing a lower electrode having a laminated structure by using the film forming apparatus 100 configured as described above will be explained.

Figure 8:
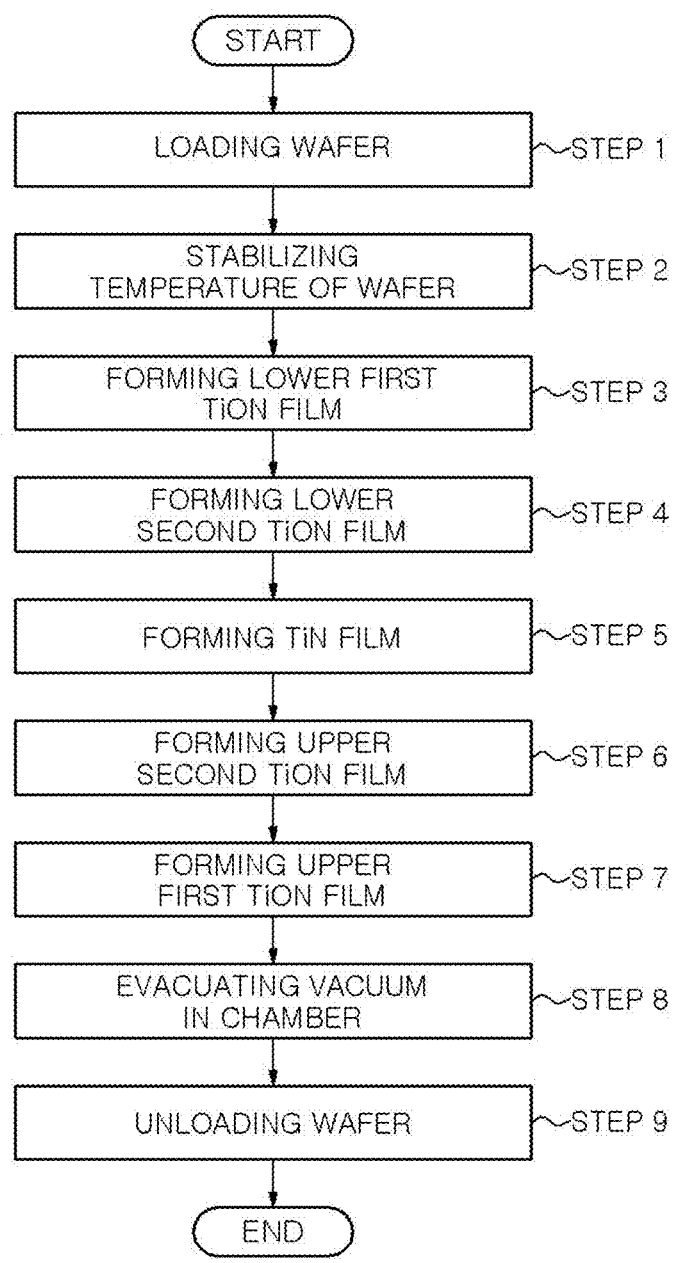
FIG. 8 is a flowchart for explaining the entire process of manufacturing the lower electrode according to the embodiment.

First, the entire process will be described with reference to the flowchart of FIG. 8.

The gate valve 43 is opened and the wafer W is loaded from the wafer transfer chamber (not shown) into the chamber 1 through the loading/unloading port 42 by a transfer unit (not shown) and then mounted on the susceptor 2 (step 1). Then, the gate valve 43 is closed and the pressure in the chamber 1 is controlled to a predetermined vacuum level. The wafer W is heated by the heater 5 to a predetermined temperature preferably ranging from 300° C. to 500° C. The wafer W is preliminarily heated by supplying $N_2$ gas into the chamber 1 and the temperature of the wafer W becomes stable (step 2).

Next, the formation of a lower first TiON film 241 (step 3), the formation of a lower second TiON film 242 (step 4), the formation of a TiN film 243 (step 5), the formation of an upper second TiON film 242 (step 6), and the formation of an upper first TiON film 241 (step 7) are consecutively performed.

Then, the chamber 1 is vacuum-evacuated (step 8). Thereafter, the gate valve 43 is opened and the wafer W is unloaded by the transfer unit of the wafer transfer chamber (step 9). In this manner, the formation of the lower electrode 204 on a single wafer W is completed.

Hereinafter, the method for forming the first TiON film 241 and the second TiON film 242 will be described in detail.

In forming the first TiON film 241 and the second TiON film 242, a cycle of alternately supplying $TiCl_4$ gas as a Ti-containing gas and $NH_3$ gas as a nitriding gas with a process of purging an inside of the chamber 1 interposed therebetween multiple times (X times), supplying the oxidizing agent, and purging the chamber 1 is repeated multiple times (Y cycles).

An example of this film forming technique will be described with reference to the timing chart of FIG. 9 and the flowchart of FIG. 10.

Figure 9:
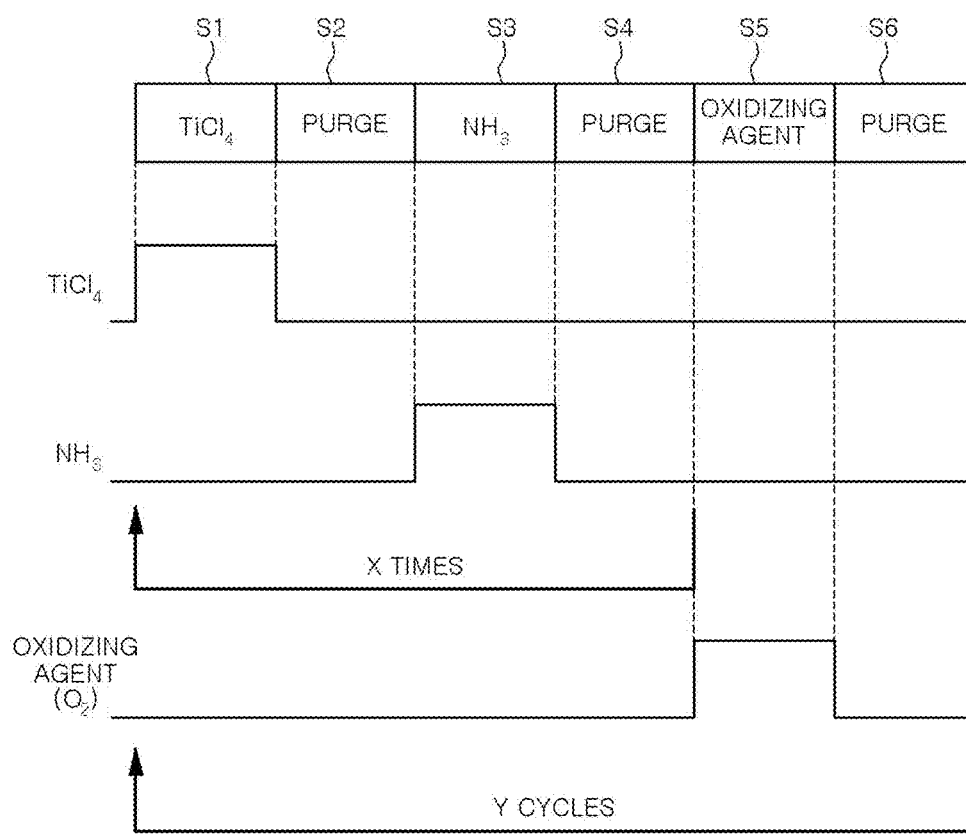
FIG. 9 is a timing chart showing an example of a technique of forming a TiON film of the lower electrode.
Figure 10:
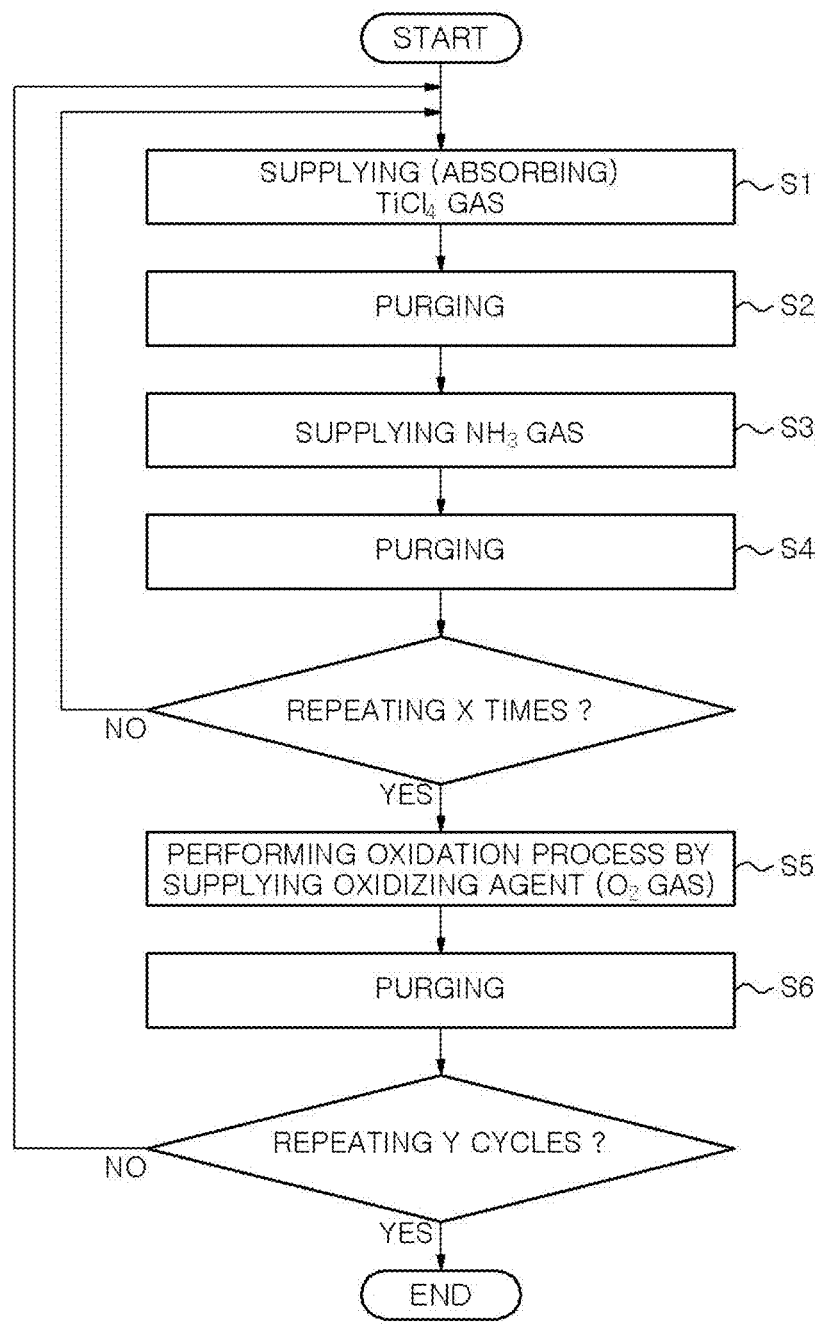
FIG. 10 is a flowchart showing the example of the technique of forming the TiON film of the lower electrode.

As can be seen from FIGS. 9 and 10, first, $TiCl_4$ gas is supplied from the $TiCl_4$ gas supply source 21 into the chamber 1 to be adsorbed (step S1). Next, the supply of $TiCl_4$ gas is stopped and the chamber 1 is purged by $N_2$ gas (step S2). Then, $NH_3$ gas is supplied from the $NH_3$ gas supply source 23 into the chamber 1 and made to react with the adsorbed $TiCl_4$, thereby forming TiN (step S3). Thereafter, the supply of $NH_3$ gas is stopped and the chamber 1 is purged by $N_2$ gas (step S4). The steps S1 to S4 are repeated X times. Then, an oxidation process is performed by supplying an oxidizing agent (e.g., $O_2$ gas) from the oxidizing agent supply source 27 into the chamber 1 (step S5). Next, the chamber 1 is purged (step S6). By repeating Y times a cycle of repeating the steps S1 to S4 X times, and performing the steps S5 and S6, a TiON film having a desired thickness is obtained.

Figure 11:
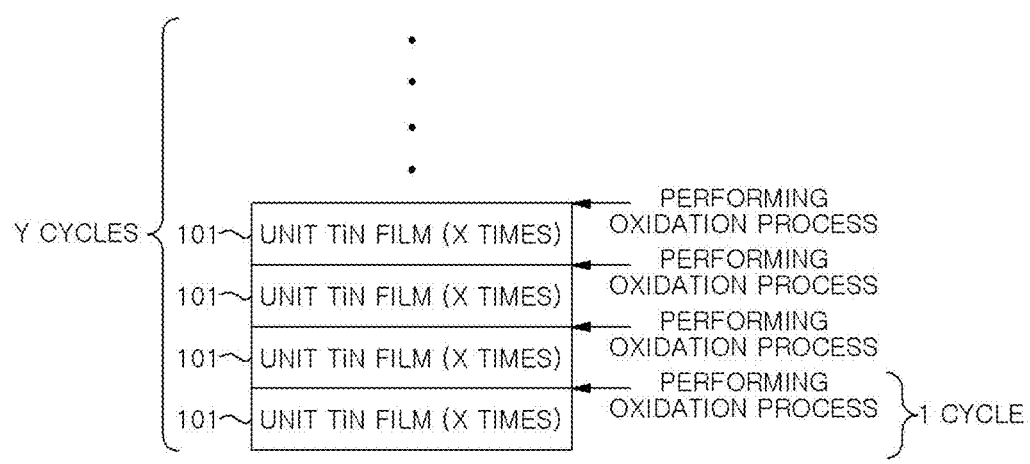
FIG. 11 schematically shows a film forming state in the case of forming films by the film forming techniques of FIGS. 9 and 10.

The state of the formed film at this time is shown in FIG. 11. As can be seen from FIG. 11, a unit TiN film 101 having a predetermined thickness is formed by repeating the steps S1 to S4 X times and, then, the unit TiN film 101 is oxidized by performing an oxidizing process in the step S5. By repeating Y times such a cycle, a TiON film having a predetermined film thickness is formed.

At this time, the amount of oxygen in the TiON film can be controlled by X, i.e., the number of repetition of the steps S1 to S4. In other words, when X is decreased, the frequency of oxidation is increased and, thus, the oxygen concentration in the film is increased. On the contrary, when X is increased, the oxygen concentration in the film is decreased.

Therefore, when the lower first TiON film 241 having a relatively low oxygen concentration is formed, the above-described sequence is executed while relatively increasing X. Then, when the lower second TiON film 242 having a relatively high oxygen concentration is formed, the above-described sequence is executed while relatively decreasing X.

The oxygen concentration in the TiON film can be adjusted by controlling an oxidation time or a flow rate of the oxidizing agent, instead of controlling X. Therefore, the oxygen concentration in the TiON film can be adjusted by controlling at least one of X, the oxidation time and the flow rate of the oxidizing agent. In the case of forming the lower second TiON film 242 after the formation of the first TiON film 241, the oxygen concentration can be controlled by performing at least one of the operations of decreasing X, increasing the oxidation time, and increasing the flow rate of the oxidizing agent.

In the case of using $TiCl_4$ gas as a Ti source gas, $NH_3$ gas as a nitriding gas, $N_2$ gas as a carrier/purge gas, and $O_2$ gas as an oxidizing agent, desired ranges of the TiON film forming conditions are as follows.

Processing temperature (susceptor temperature): 300 to 500° C.

Pressure in chamber: 13.33 to 1333 Pa (0.1 to 10 Torr)

$TiCl_4$ gas flow rate: 10 to 200 mL/min(sccm)

$NH_3$ gas flow rate: 1000 to 10000 mL/min(sccm)

$N_2$ gas flow rate: 1000 to 30000 mL/min(sccm)

Duration of steps 1 to 4 per once: 0.01 to 3 sec $O_2$ gas flow rate: 10 to 3000 mL/min(sccm)

$O_2$ gas supply period: 0.1 to 60 sec

Figure 12:
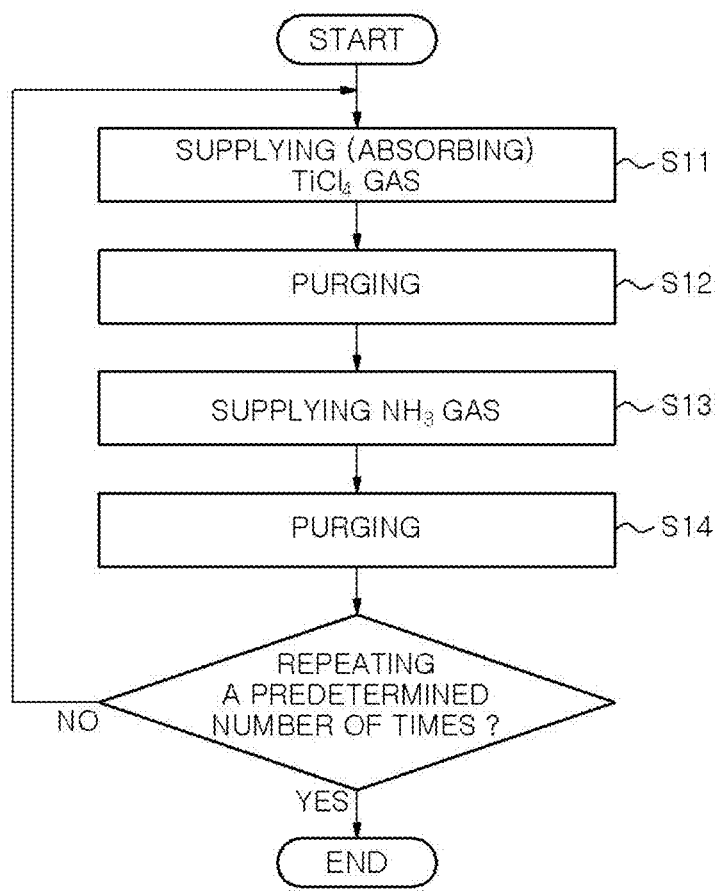
FIG. 12 is a flowchart showing an example of a technique of forming a TiN film of the lower electrode.

In the case of forming the TiN film 243 after the formation of the lower second TiON film 242, as shown in the flowchart of FIG. 12, first, $TiCl_4$ gas is supplied from the $TiCl_4$ gas supply source 21 into the chamber 1 to be adsorbed (step S11). Next, the supply of $TiCl_4$ gas is stopped and the chamber 1 is purged by $N_2$ gas (step S12). Then, $NH_3$ gas is supplied from the $NH_3$ gas supply source 23 into the chamber 1 and made to react with the adsorbed $TiCl_4$, thereby forming TiN (step S13). Thereafter, the supply of $NH_3$ gas is stopped and the chamber 1 is purged by $N_2$ gas (step S14). The steps S11 to S14 are repeated a predetermined number of times. The steps S11 to S14 may be executed under the same conditions of the steps S1 to S4.

Next, the upper second TiON film 242 and the upper first TiON film 241 may be formed while ensuring desired oxygen concentrations by controlling the number of repetition X or the like as in the case of forming the lower first TiON film 241 and the lower second TiON film 242.

In the case of forming the lower electrode 204 having the structure shown in FIGS. 5 and 6, the first TiON film 241 and the second TiON film 242 may be formed with desired thicknesses by controlling the oxygen concentration of the film by adjusting the number of repetition X or the like by the aforementioned film forming technique.

(Other Application)

The disclosure is not limited to the above-described embodiments and may be variously modified. For example, the structure of the lower electrode is not limited to those shown in FIGS. 2, 5 and 6 and may vary as long as TiON films having a relatively low oxygen concentration are formed at opposite outermost sides and a TiON film having a relatively high oxygen concentration is formed therebetween. Further, a TiN film or a TiON film with an oxygen concentration may be formed at the central portion. The film forming apparatus shown in FIG. 7 is merely an example and the lower electrode of the present disclosure may also be manufactured by another apparatus other than the apparatus shown in FIG. 7.

While the disclosure has been shown and described with respect to the embodiments, it will be understood by those skilled in the art that various changes and modifications may be made without departing from the scope of the disclosure as defined in the following claims.

What is claimed is:

1. A DRAM capacitor including a lower electrode which is made of a TiN-based material and a dielectric film, wherein the lower electrode comprises:
   first TiON films provided at opposite outer sides, the first TiON films having a relatively low oxygen concentration; and
   a second TiON film provided between the first TiON films, the second TiON film having a relatively high oxygen concentration, and
   wherein the dielectric film is provided on the lower electrode.

2. The DRAM capacitor of claim 1, wherein the lower electrode has a three-layer structure in which the first TiON films are formed at opposite outer sides of the second TiON film.

3. The DRAM capacitor of claim 1, wherein the lower electrode has a five-layer structure in which a TiN film is provided between the first TiON films, and the second TiON film is provided between the TiN film and each of the first TiON films.

4. The DRAM capacitor of claim 1, wherein the lower electrode has a five-layer structure in which a third TiON film having an oxygen concentration lower than the oxygen concentration of the second TiON film is provided between the first TiON films, and the second TiON film is provided between the third TiON film and each of the first TiON films.

5. The DRAM capacitor of claim 1, wherein the lower electrode has a film structure symmetrical in a thickness direction.

6. The DRAM capacitor of claim 1, wherein the oxygen concentration of each of the first TiON films is within a range from 30 at. % to 40 at. %.

7. The DRAM capacitor of claim 1, wherein a film thickness of each of the first TiON films is within a range from 0.5 nm to 5 nm.

8. The DRAM capacitor of claim 1, wherein the oxygen concentration of the second TiON film is higher than 40 at. %.

9. The DRAM capacitor of claim 1, wherein a film thickness of the second TiON film is within a range from 0.5 nm to 5 nm.

10. A method of manufacturing a lower electrode which is made of a TiN-based material and provided at a base of a dielectric film in a DRAM capacitor, the method comprising:
    accommodating a target substrate in a processing chamber, maintaining an inside of the processing chamber in a depressurized state, and forming a first TiON film having a relatively low oxygen concentration by repeating a predetermined number of times a cycle of forming a unit nitride film at a predetermined processing temperature by alternately supplying a Ti-containing gas and a nitriding gas multiple times with a process of purging the inside of the processing chamber interposed therebetween and then oxidizing the unit nitride film by supplying an oxidizing agent;
    forming a second TiON film having a relatively high oxygen concentration on the first TiON film by repeating a predetermined number of times a cycle of forming a unit nitride film by alternately supplying the Ti-containing gas and the nitriding gas multiple times with the process of purging the inside of the processing chamber interposed therebetween and then oxidizing the unit nitride film by supplying the oxidizing agent; and
    forming another first TiON film as an uppermost layer,
    wherein oxygen concentrations of the first TiON film and the second TiON film are controlled by at least one of the number of alternate supply of the Ti-containing gas and the nitriding gas in the case of forming the unit nitride film, an oxidation time of the unit nitride film, and a flow rate of the oxidizing agent in the oxidation process.

11. The method of claim 10, wherein the Ti-containing gas is $TiCl_4$ gas and the nitriding gas is $NH_3$ gas.

12. The method of claim 10, wherein the oxidizing agent is an oxygen-containing gas selected from a group consisting of $O_2$ gas, $O_3$ gas, $H_2O$ and $NO_2$ or a plasma of the oxygen-containing gas.

13. The method of claim 10, wherein the processing temperature is within a range from 300° C. to 500° C.

14. A method of manufacturing a lower electrode which is made of a TiN-based material and provided at a base of a dielectric film in a DRAM capacitor, the method comprising:
    accommodating a target substrate in a processing chamber, maintaining an inside of the processing chamber in a depressurized state, and forming a first TiON film having a relatively low oxygen concentration by repeating a predetermined number of times a cycle of forming a unit nitride film at a predetermined processing temperature by alternately supplying a Ti-containing gas and a nitriding gas multiple times with a process of purging the inside of the processing chamber interposed therebetween and then oxidizing the unit nitride film by supplying an oxidizing agent;
    forming a second TiON film having a relatively high oxygen concentration on the first TiON film by repeating a predetermined number of times a cycle of forming a unit nitride film by alternately supplying the Ti-containing gas and the nitriding gas multiple times with the process of purging the inside of the processing chamber interposed therebetween and then oxidizing the unit nitride film by supplying the oxidizing agent;
    forming a TiN film on the second TiON film by alternately supplying the Ti-containing gas and the nitriding gas with the process of purging the inside of the processing chamber interposed therebetween;
    forming another second TiON film on the TiN film; and
    forming another first TiON film on the another second TiON film,
    wherein oxygen concentrations of the first and the second TiON film are controlled by at least one of the number of alternate supply of the Ti-containing gas and the nitriding gas in the case of forming the unit nitride film, an oxidation time of the unit nitride film, and a flow rate of the oxidizing agent in the oxidation process.

15. The method of claim 14, wherein the Ti-containing gas is $TiCl_4$ gas and the nitriding gas is $NH_3$ gas.

16. The method of claim 14, wherein the oxidizing agent is an oxygen-containing gas selected from a group consisting of $O_2$ gas, $O_3$ gas, $H_2O$ and $NO_2$ or a plasma of the oxygen-containing gas.

17. The method of claim 14, wherein the processing temperature is within a range from 300° C. to 500° C.

* * * * *